United States Patent [19]

Brady

[11] Patent Number: 5,103,289
[45] Date of Patent: Apr. 7, 1992

[54] DUAL SIP PACKAGE STRUCTURES

[75] Inventor: Peter J. Brady, Glendale, Ariz.

[73] Assignee: Square D Company, Palatine, Ill.

[21] Appl. No.: 475,838

[22] Filed: Feb. 6, 1990

[51] Int. Cl.⁵ .................... H01L 23/28; H01L 23/48
[52] U.S. Cl. ........................................ 357/72; 357/70; 357/75
[58] Field of Search .............. 357/67, 75, 72, 70, 357/69; 174/52.4

[56] References Cited

U.S. PATENT DOCUMENTS

| | | | |
|---|---|---|---|
| 4,160,308 | 7/1979 | Courtney et al. | 357/70 |
| 4,189,085 | 2/1980 | Penrod | 228/173 |
| 4,197,555 | 4/1980 | Uehara et al. | 357/70 |
| 4,214,120 | 7/1980 | Jones, Jr. et al. | 174/52 |
| 4,288,912 | 9/1981 | Wills et al. | 357/70 |
| 4,633,582 | 1/1987 | Ching et al. | 29/827 |
| 4,675,718 | 6/1987 | Tsubokura et al. | 357/70 |
| 4,739,440 | 4/1988 | Fujiki et al. | 361/329 |
| 4,801,561 | 1/1989 | Sankhagowit | 437/207 |
| 4,935,803 | 6/1990 | Kalfas et al. | 357/69 |

Primary Examiner—Rolf Hille
Assistant Examiner—S. V. Clark
Attorney, Agent, or Firm—Michael J. Femal; Charles R. Hoffman

[57] ABSTRACT

A dual SIP package for encapsulating a plurality of semiconductor die includes a first group of elongated metal leads each having first and second end portions, and a first group of enlarged metal pads each attached to the first end portion of one of the leads of the first group, a second group of elongated metal leads each having first and second end portions, and a second group of enlarged metal pads each attached to the first end portion of one of the leads of the second group, each of the pads of the first group being parallel to and aligned with a corresponding pad of the second group to form a pair. The first end portion of each of the leads of the first group is parallel to and aligned with the first end portion of a lead of the second group. Each of the die is disposed between and connected to a pair of the pads. The bottom electrode of each die is attached to a pad of the first group, and the top electrode of each die is attached to a pad of the second group. Plastic encapsulation surrounds the die, the first group of pads, and the first end portion of each of the leads of the first and second groups. The second end portion of each lead of the first and second groups extends beyond the encapsulation.

8 Claims, 2 Drawing Sheets

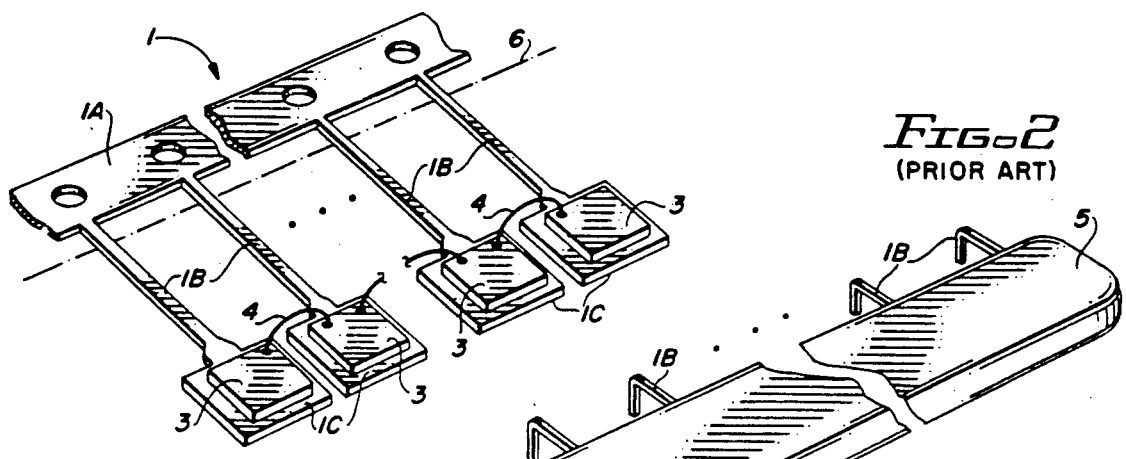
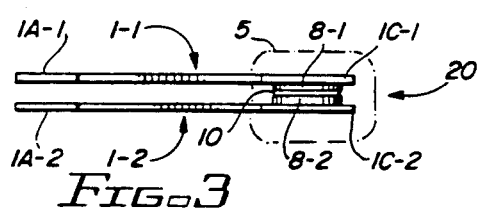
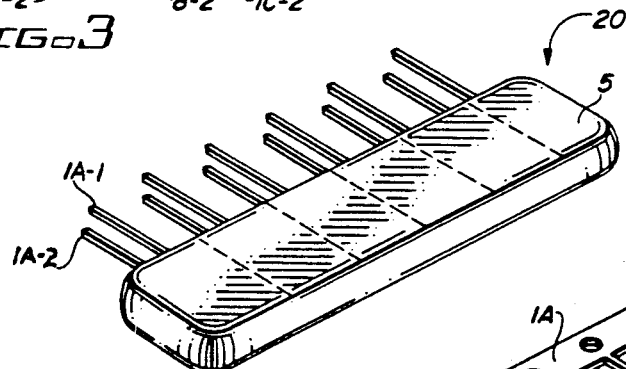
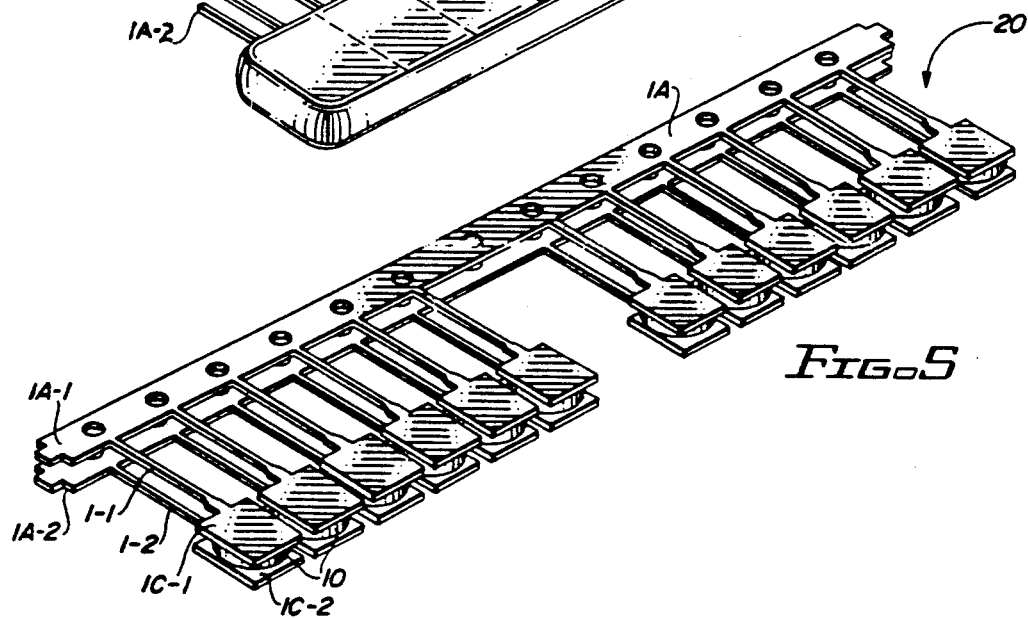

DUAL SIP PACKAGE STRUCTURES

BACKGROUND OF THE INVENTION

The present invention relates to a dual SIP (Single In-Line Package) package from a pair of individual SIP leadframes and to encapsulating components such as transient voltage suppressor chips in the dual SIP package.

SIP (Single In-Line Package) structures are well-known. An SIP leadframe 1 is shown in FIG. 1 with a plurality of conductor chips and/or other components) attached thereto. The leadframe includes a metal support strip 1A and a plurality of perpendicular leads 1B. Dotted line 6 indicates that the support strip is clipped off after manufacture of the SIP package has been completed. An enlarged metal pad 1C is attached to and integral with the outer end of each of the leads 1B. A semiconductor chip 3 (or other component such as a capacitor) is attached to each pad 1C. Various bonding wires such as 4 are attached between bonding areas of the various chips/components 3.

The portion of the leadframe including the pads 1C, chips 3, bonding wires 4, and a portion of the leads 1B is encapsulated in plastic 5 using various conventional techniques. The support strip 1A is clipped away along dotted line 6, and if desired, the ends of the leads 1B are suitably bent. The leads then can be soldered to a printed circuit board or other elements. Such prior art using bonding wires results in unacceptable transient voltage suppression due to the inherent parasitic resistance and inductance of the bonding wires. There exist prior art schemes using continuous bars instead of bonding wires. These schemes reduce such parasitic inductance and resistance but severely limit the possible circuit topologies, and use up one pad location only for making electrical connection back to the SIP lead frame by using a short cell.

There is a substantial need for semiconductor components containing high power chips (such as the assignee's TRANSZORB transient voltage suppressor chips which are capable of dissipating transient high power) small enough to fit into small spaces, for example on a small crowded printed circuit board disposed within a cable connector housing having a large number of individual signal conductors each of which needs to be protected from transient voltages.

At the present state of the art, the main commercially available choices for transient voltage suppressors include those mounted in so-called axial lead packages, in which the two leads of a transient voltage suppressor extend in opposite directions along a common axis. These devices are usually physically large, and have a large "footprint", that is, when installed on a printed circuit board, they cover a large amount of area of the printed circuit board. Other transient voltage suppressors are packaged in DIP Packages (Dual In-line Packages), but such devices typically are incapable of dissipating enough power to result in reliable transient voltage suppression. Furthermore, such devices typically have large lead inductance which interfere with effective suppression of large, high speed transient voltages. Surface mount packages also are available; they typically have a large "footprint", and are not suitable for "high density" applications in which a number of high power transient voltage suppressors are required in a very small volume, such as in a multiconductor cable connector or adapter.

There remains a need for a transient voltage suppressor package for encapsulating a large number of high power transient voltage suppressor devices and also capable of being housed in a small volume, and providing low parasitic lead inductance.

SUMMARY OF THE INVENTION

It is an object of the invention to provide economical, compact package for encapsulating components such as semiconductor chips capable of dissipating substantial power.

It is another object of the invention to provide an economical, compact package with high power dissipation capability, low lead inductance, for encapsulating a large number of high power transient voltage suppressor chips or other components.

It is another object of the invention to provide a dual in-line package structure that is economical, compact, has high power dissipation capability and low lead inductance, and does not require the use of internal wire bonding or shorting bars.

It is another object of the invention to provide a cable connector or adapter having individual transient voltage suppression for each of a large number of conductor cables therein, and also having high power dissipation capability and low parasitic lead inductances and resistances.

It is another object of the invention to provide a package structure which facilitates versatile interconnecting of electrodes of suppressor diodes and the like.

Briefly described, and in accordance with one embodiment thereof, the invention provides a dual SIP package for encapsulating a plurality of semiconductor die, each having a top electrode and a bottom electrode, the package including a first group of elongated metal leads each having first and second end portions, and a first group of enlarged metal pads each attached to the first end portion of one of the leads of the first group, respectively, a second group of elongated metal leads each having first and second end portions, and a second group of enlarged metal pads each attached to the first end portion of one of the leads of the second group, respectively. Each of the pads of the first group is parallel to and aligned with a corresponding pad of the second group to form a pair, the first end portion of each of the leads of the first group being parallel to and aligned with the first end portion of a lead of the second group. Each of the die is disposed between and connected to a pair of the pads, respectively, the bottom electrode of each die being attached to a pad of the first group, and the top electrode of each die being attached to a pad of the second group. Encapsulation surrounds the plurality of die, the first group of pads, and the first end portion of each of the leads of the first and second groups, the second end portion of each lead of the first and second groups extending beyond the encapsulation. The encapsulation preferably forms a hermetic seal for the die.

In the described embodiment, each of the die is a transient voltage suppressor die having a power dissipation capability of at least approximately 1500 watts. Each die is attached between first and second parallel conductive disks of a predetermined thermal mass, forming a cell that is attached between the pads of a pair, respectively. To manufacture the package, solder paste is placed on each pad of first and second SIP leadframes. The first SIP leadframe includes a first group of the pads and a first group of corresponding elongated leads each having a first end portion attached to a corresponding pad and a second end portion attached to a first support strip. The second SIP leadframe includes a second group of the pads and a second group of corresponding elongated leads, each having a first end portion attached to a corresponding pad and a second end portion attached to a second support strip.

In the manufacturing process, a plurality of the cells, each including one of the die between and attached to a pair of parallel conductive disks, are placed on the solder paste of one of the pads of the first SIP leadframe, respectively. The second SIP leadframe is aligned with the first SIP leadframe and the solder paste on the pads of the second SIP leadframe is placed against the cells on the first SIP leadframe so that the pads, leads, and first support strip of the first SIP leadframe are parallel to the pads, leads, and second support strip of the second SIP leadframe, respectively, with the cells sandwiched therebetween. The first and second SIP leadframes and cells therebetween are heated to melt solder in the solder paste, and then are cooled to thereby solder the pads of the first and second SIP leadframes to the cells, respectively.

BRIEF DESCRIPTION OF THE DRAWINGS

FIG. 1 is a partial perspective view of an SIP leadframe assembly of the prior art.

FIG. 2 is a perspective view of the leadframe assembly of FIG. 1 after encapsulation.

FIG. 3 is an elevational view of a dual SIP package of the present invention.

FIG. 4 is a perspective view of the dual SIP structure of FIG. 3 after encapsulation.

FIG. 5 is a perspective view of the structure of FIG. 3 prior to encapsulation and removal of the leadframe support strips 1A.

DETAILED DESCRIPTION OF THE PREFERRED EMBODIMENTS

Figure 6:
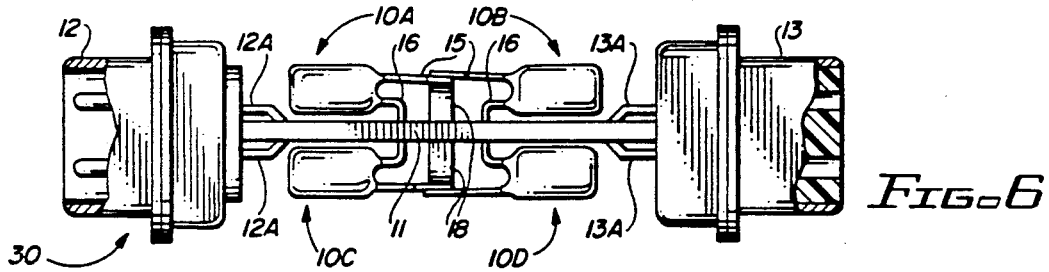
FIG. 6 is a side elevation view of a 25 pin transient voltage suppressor (TVS) protected RS232 cable adapter.

Referring to FIGS. 3-5, the dual SIP 20 includes two SIP leadframes 1-1 and 1-2 each of which is identical to SIP leadframe 1 of FIG. 1, except without chips 3 and wire bonds 4.

A conductive disc 8-1 is electrically and thermally bonded to pad 1C-1 of leadframe 1-1. Similarly, a conductive disc 8-2 is electrically and thermally bonded to the pad 1C-2 of leadframe 1-2. Typical dimensions of pads 1C-1 and 1C-2 are 160 mils by 160 mils. Conductive discs 8-1 and 8-2 typically are circular, 130 mils in diameter, 20 mils thick, typically are composed of copper, and function as thermal masses to allow rapid absorption of heat from die 10.

Semiconductor chip 10, which can be a TRANSZORB TVS chip marketed by the assignee, has opposite upper and lower electrodes electrically (and thermally) attached to the exposed surfaces of conductive discs 8-1 and 8-2, forming a rigid structure in which the leads 1A-1 and 1A-2 of leadframes 1-1 and 1-2 are parallel. Dotted line 5 in FIG. 3 designates plastic encapsulation that is formed after assembly of chip 10, conductive discs 8-1 and 8-2, and the two SIP leadframes 1-1 and 1-2. FIG. 4 shows the completed device with the two parallel rows of leads 1A-1 and 1A-2, the two rows being spaced approximately 40 mils apart. Various conventional encapsulating techniques, such as dipping pads 3 and the chips 10 into suitable epoxy material, transfer molding techniques, or ceramic packaging techniques could be used to provide hermetic seals with the various leads extending from the encapsulation 5.

The above described package structure provides very short, low inductance, low resistance leads, especially if they are clipped short and shaped to provide surface mount terminals. Excellent thermal bonding with chip 10 is achieved, and dissipated heat is rapidly transferred to the printed circuit board or other conductors to which the leads 1A-1 and 1A-2 are connected. Consequently, high power dissipation transient voltage suppressor chips can be used. The closest prior art suppressor chips that are used in multiconductor cable connectors or the like are limited to 500 watt axial lead devices. The present invention allows use of 1500 watt suppressor diode chips, which results in much more effective transient voltage suppression.

The dual SIP structure 20 of FIGS. 1-5 provides considerable flexibility as to how the device is connected to a printed circuit board and/or other conductors. A much smaller "footprint" (or ratio of printed circuit board area covered per diode) is achieved than for previous transient suppressor diode packages, resulting in a much higher packaging density without sacrificing the needed high power handling capability and without introducing excessive lead inductance or other parasitic elements. Very low lead resistance also is achieved.

The dual SIP package (once encapsulated with the metal support strip trimmed off) can be assembled on a printed wiring board (PWB) by inserting its two rows of individual leads into an appropriately spaced set of plated through holes in the PWB much like numerous other electrical components. The radial mounting mode results in very short lengths of leads 1B between the PWB and the enlarged metal pad 1C. Once inserted, the dual SIP package is clinched, clipped, fluxed, soldered, and cleaned like many other typical PWB mounted components.

Another advantage of the invention is that the leadframe structure can be easily cut to any desired length to thereby provide any desired number of leads for each individual dual SIP package. This is a significant advantage because it avoids the need to make tooling for each of the different leadframes required for different sized dual SIP packages. The interconnection of chips 10 can be readily "programmed" on a printed circuit board to provide various series-parallel interconnections of chips such as 10, as subsequently explained with reference to FIG. 8.

Figure 7:
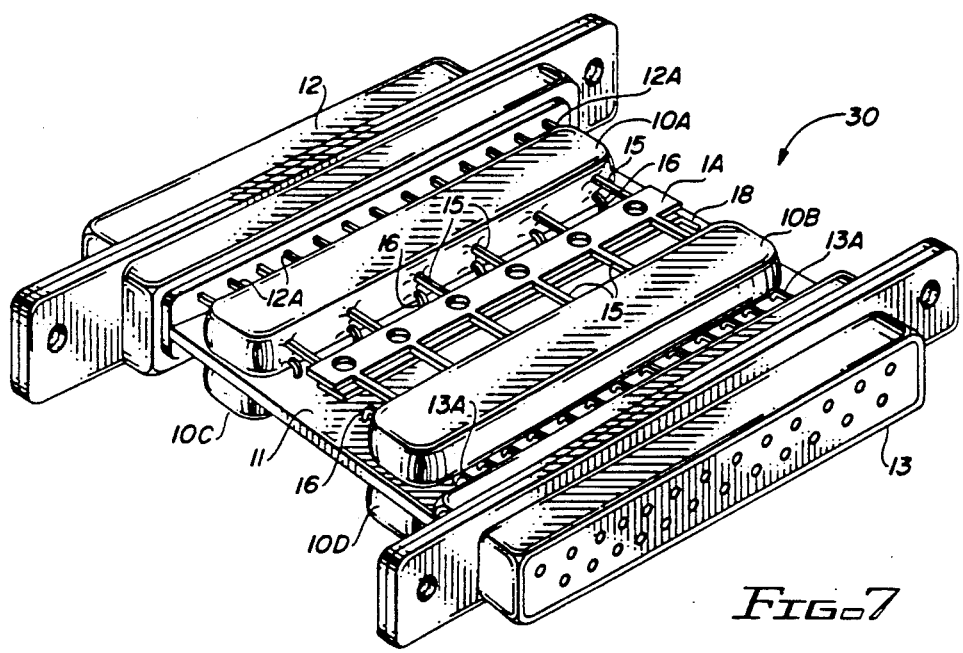
FIG. 7 is a perspective view of the cable adapter of FIG. 6.

Referring to FIG. 6, a 25 pin RS232 cable adapter 30 is shown using four of the dual SIP structures 10A-D shown in FIGS. 1-5 to provide TVS protection to 24 of the 25 leads. (The ground connector does not need TVS protection.) FIG. 7 shows a perspective view of cable adapter 30 (minus a suitable housing, which can consist of a pair of halves that fit together to enclose the dual SIP packages 10A-D and the printed circuit board 11). Numeral 12 designates a "male" 25 pin RS232 connector, and numeral 13 designates a "female" 25 pin RS232 connector. Male connector 12 has 25 leads 12A and female connector 13 has 25 leads 13A. The leads 12A and 13A are soldered to various metal traces, each corresponding to a different lead of male connector 12 and a corresponding lead 13A of female connector 13 on the upper and lower surfaces of printed circuit board 11.

Dual SIP packages 10A and 10B, each of which contains six pairs of leads, is attached to the upper surface of printed circuit board 11 by its lower row 16 of leads. Lower leads 16 of each of dual SIP packages 10A and 10B are bent downward, inserted through predrilled holes in printed circuit board 11, and are soldered to conductive metal traces to which the individual connector leads 12A and 13A are respectively soldered.

The upper row of leads 15 of each of dual SIP packages 10A and 10B are still connected to their respective leadframe strips IA (see FIG. 1), are soldered together, and are connected to the common ground lead, as indicated by numeral 18 in FIGS. 6 and 7. Dual SIP packages 10C and 10D are connected to the bottom surface of printed circuit board 11 in essentially the same manner.

Cable adapter 30 is only two and one-fourth inches wide, and 0.6 inches deep, yet encloses twenty-four 1500 watt suppressor diodes, provides very low parasitic lead inductance and lead resistance, and provides excellent transient voltage suppression for 24 conductors. No previous device has provided this level of transient voltage suppression in such a small cable connector assembly.

Figure 8:
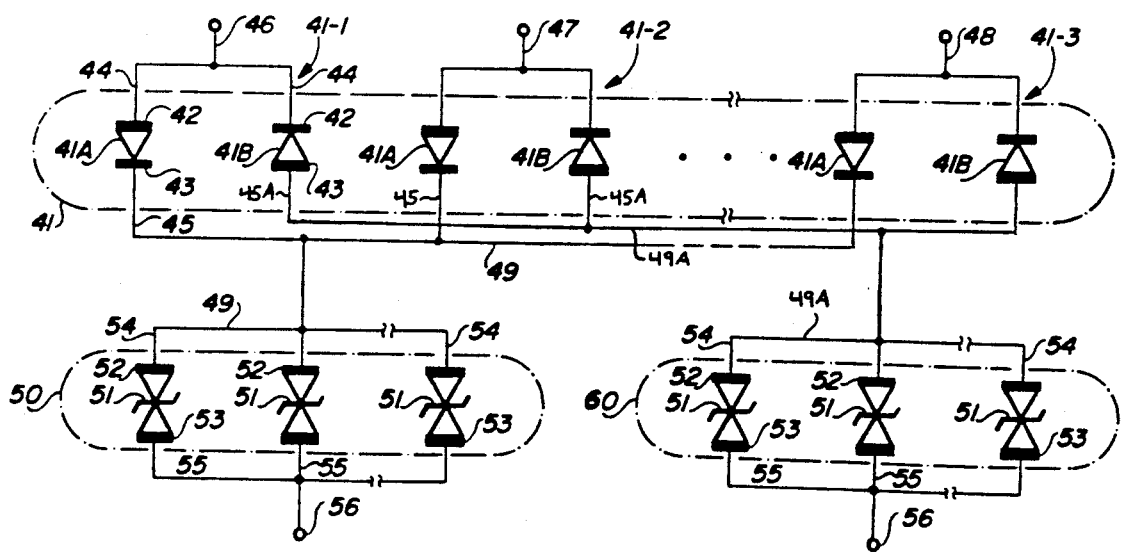
FIG. 8 is a schematic diagram useful in describing "programming" of interconnections between transient suppressor diodes in the dual SIP package of the present invention by means of printed circuit board conductors.

Referring to FIG. 8, a more complex TVS circuit structure is shown, using the dual SIP structure of the present invention. Electrical connections between the various electrodes can be "programmed" as desired by providing suitable metal traces on a printed wire board (PWB).

In FIG. 8, a suitable number of zener diode suppressor chips 51 are packaged in a dual SIP 50. The dark lines 52 designate pads of the upper leadframe member, and numeral 54 designates leads extending therefrom. The darkened lines 53 indicate the lower SIP pads such as 1C in FIG. 1, and numerals 55 designate the leads extending therefrom. The parallel-connected pulse suppressor diodes 51 provide high power transient voltage suppression capability. Numerals 49 and 56 represent metal traces on the printed circuit board to which the dual SIP package 50 is soldered.

The dual SIP package 41 includes the three illustrated pairs 41-1, 41-2, and 41-3, each including a low capacitance diode 41A connected in reverse parallel connection to a low capacitance diode 41B. The upper pad switches 1C (FIG. 1) of each diode 41A or 41B is designated by numeral 42, and the lead extending therefrom is designated by numeral 44. The lower pad of each diode 41A is designated by 43 and the lead extending therefrom is designated by numeral 45. The leads 45 are connected to PWB trace 49. The lower pad of each diode 41B also is designated by 43, but the lead extending from it is designated by 45A. The leads 45A are connected to PWB trace 49A.

Numerals 46, 47, and 48 designate traces on the printed wiring board (not shown) to which dual SIP packages 50 and 41 are soldered. The circuit 40 is useful in providing transient voltage suppression for multiple conductor cables or connectors in which low capacitance is needed. The steering diode array of package 41 allows multiple lines to be protected in both polarities using dual SIP packaged suppressors 50 and 60. Use of parallel matched suppression diodes in packages 50 and 60 results in a substantially higher energy handling capability in a small volume.

The invention provides a dual SIP structure which allows use of large high powered chips, with large area, low thermal resistance, low electrical resistance, and low inductance connection of each electrode of the chips to leads of the package, and provides a so-called "radial" lead structure (as opposed to axial lead) that results in relatively small "footprints" on a printed circuit board. The structure has the advantage of minimizing the various undesirable lead resistance and lead inductance parasitic elements of the package.

While the invention has been described with reference to several particular embodiments thereof, those skilled in the art will be able to make the various modifications to the described embodiments of the invention without departing from the true spirit and scope of the invention.

What is claimed is:

1. A dual SIP package for encapsulating a plurality of semiconductor die, each having a top electrode and a bottom electrode, the package comprising in combination:

(a) a first group of elongated metal leads each having first and second end portions, and a first group of enlarged metal pads each attached to the first end portion of one of the leads of the first group, respectively;

(b) a second group of elongated metal leads each having first and second end portions, and a second group of enlarged metal pads each attached to the first end portion of one of the leads of the second group, respectively, each of the pads of the first group being parallel to and aligned with a corresponding pad of the second group to form a pair, the first end portion of each of the leads of the first group being parallel to and aligned with the first end portion of a lead of the second group, each of the die being disposed between and connected to a pair of the pads, respectively, the bottom electrode of each die being attached to a pad of the first group, and the top electrode of each die being attached to a pad of the second group, each die being attached between first and second parallel conductive disks that form a predetermined thermal mass, forming a cell that is attached between the pads of a pair, respectively;

(c) encapsulation surrounding the plurality of die, the first group of pads, and the first end portion of each of the leads of the first and second groups, the second end portion of each lead of the first and second groups extending beyond the encapsulation.

2. The dual SIP package of claim 1 wherein the encapsulation forms a hermetic seal.

3. The dual SIP package of claim 2 wherein the encapsulation is composed of epoxy.

4. The dual SIP package of claim 1 wherein each of the die is a transient voltage suppressor die.

5. The dual SIP package of claim 4 wherein each die has a transient power dissipation capability of at least approximately 1500 watts.

6. The dual SIP package of claim 1 wherein there are no wire bonds connected to any of the die.

7. A dual SIP package for encapsulating a plurality of semiconductor die, formed by the process of:

(a) placing solder paste on each pad of first and second SIP leadframes, the first SIP leadframe including a first group of the pads and a first group of corresponding elongated leads each having a first end portion attached to a corresponding pad and a second end portion attached to a first support strip, the second SIP leadframe including a second group of the pads and a second group of corresponding elongated leads, each having a first end portion attached to a corresponding pad and a second end portion attached to a second support strip;

(b) placing a plurality of cells, each including one of the die, respectively, between and attached to a pair of parallel conductive disks, on the solder paste of one of the pads of the first SIP leadframe, respectively, each die being attached between first and second parallel conductive disks that form a predetermined thermal mass, forming such a cell;

(c) aligning the second SIP leadframe with the first SIP leadframe and placing the solder paste on the pads of the second SIP leadframe against the cells on the first SIP leadframe so that the pads, leads, and first support strip of the first SIP leadframe are parallel to the pads, leads, and second support strip of the second SIP leadframe, respectively, with the cells sandwiched therebetween;

(d) heating portions of the first and second SIP leadframes and cells therebetween enough to melt solder in the solder paste and then cooling the first and second SIP leadframes to solder the pads of the first and second SIP leadframes to the cells, respectively.

8. A dual SIP package of encapsulating a plurality of semiconductor die, each having a top electrode and a bottom electrode, the package comprising in combination:

(a) a first group of elongated metal leads each having first and second end portions, and a first group of enlarged metal pads each attached to the first end portion of one of the leads of the first group, respectively;

(b) a second group of elongated metal leads each having first and second end portions, and a second group of enlarged metal pads each attached to the first end portion of one of the leads of the second group, respectively, each of the pads of the first group being parallel to and aligned with a corresponding pad of the second group to form a pair, the first end portion of each of the leads of the first group being parallel to and aligned with the first end portion of a lead of the second group, each of the die being disposed between and connected to a pair of the pads, respectively, the bottom electrode of each die being attached to a pad of the first group, and the top electrode of each die being attached to a pad of the second group, each of the die being a transient voltage pulse suppressor diode;

(c) encapsulation surrounding the plurality of die, the first group of pads, and the first end portion of each of the leads of the first and second groups, the second end portion of each lead of the first and second groups extending beyond the encapsulation.

* * * * *